United States Patent [19]

Pennock

[11] Patent Number: 4,823,092
[45] Date of Patent: Apr. 18, 1989

[54] MOS TRANSCONDUCTANCE AMPLIFIER FOR ACTIVE FILTERS

[75] Inventor: John L. Pennock, Edinburgh, Scotland

[73] Assignee: Wolfson Microelectronics Limited, Edinburgh, United Kingdom

[21] Appl. No.: 10,197

[22] PCT Filed: May 23, 1986

[86] PCT No.: PCT/GB86/00289
§ 371 Date: Jan. 23, 1987
§ 102(e) Date: Jan. 23, 1987

[87] PCT Pub. No.: WO86/07215
PCT Pub. Date: Dec. 4, 1986

[30] Foreign Application Priority Data
May 28, 1985 [GB] United Kingdom ............... 8513329

[51] Int. Cl.$^4$ ............................................. H03F 3/45
[52] U.S. Cl. ............................................. 330/253; 330/258; 330/300; 330/311
[58] Field of Search .............. 330/253, 258, 300, 311

[56] References Cited
U.S. PATENT DOCUMENTS
| | | | |
|---|---|---|---|
| 4,010,425 | 3/1977 | Dingwall et al. | 330/253 X |
| 4,406,990 | 9/1983 | Noro | 330/296 |
| 4,427,903 | 1/1984 | Sugimoto | 307/355 |
| 4,520,324 | 5/1985 | Jett, Jr. et al. | 330/253 X |

FOREIGN PATENT DOCUMENTS
| | | |
|---|---|---|
| 0139078 | 5/1985 | European Pat. Off. . |
| 0159654 | 10/1985 | European Pat. Off. . |
| 2535546 | 5/1984 | France . |
| 2552949 | 4/1985 | France . |
| 2002980 | 2/1979 | United Kingdom . |

OTHER PUBLICATIONS

Matsui, Matsuura, and Iwasaki; "1982 International Symposium on Circuits and Systems, vol. 2 of 3"; pp. 241-244; May 10-12.

Primary Examiner—James B. Mullins
Attorney, Agent, or Firm—Dann, Dorfman, Herrell and Skillman

[57] ABSTRACT

A differential input, differential output transconductor for IC fabrication comprises a matched pair of field-effect transistors (10) whose source terminals (11) are connected together to a first fixed voltage, the substrate terminals are connected together to a second fixed voltage and the quiescent voltages of the gate terminals (12) are equal. The FETs are biassed in the triode region of operation for the expected gate-source voltage and signal voltages of equal but opposite polarity are superimposed on the gate terminals (12) of the FETs. Circuitry is disclosed to maintain the voltage of the drain terminals (13) and to transmit the differential-mode output current component at a higher impedance level to output circuitry. A common-mode bias stabilization circuit, a phase neutralizing circuit and active filter circuits are also disclosed.

4 Claims, 18 Drawing Sheets

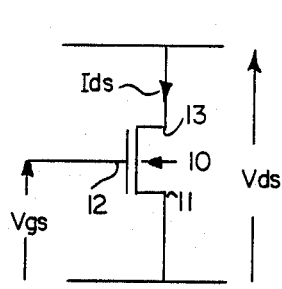
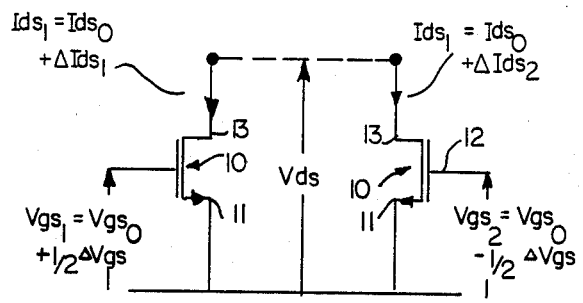
FIG. 1
PRIOR ART
FIG. 2
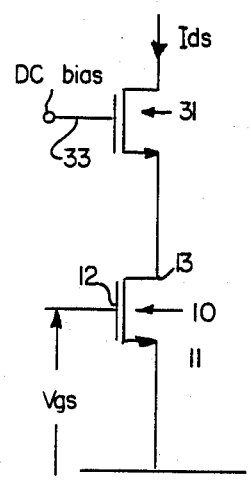
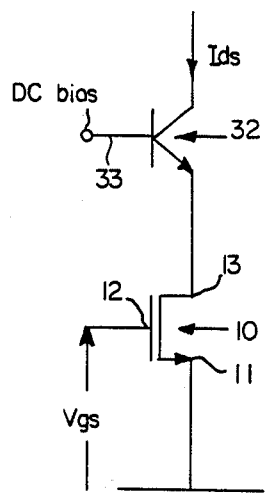
FIG. 3
FIG. 4

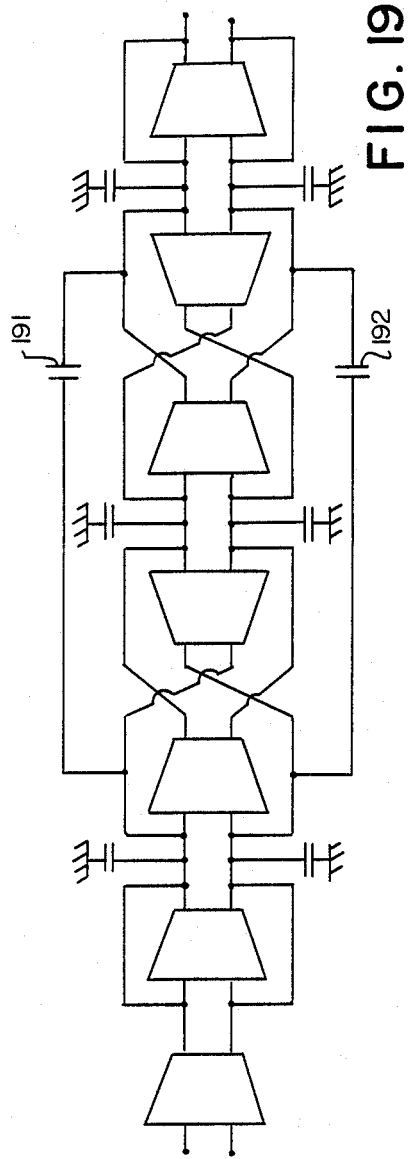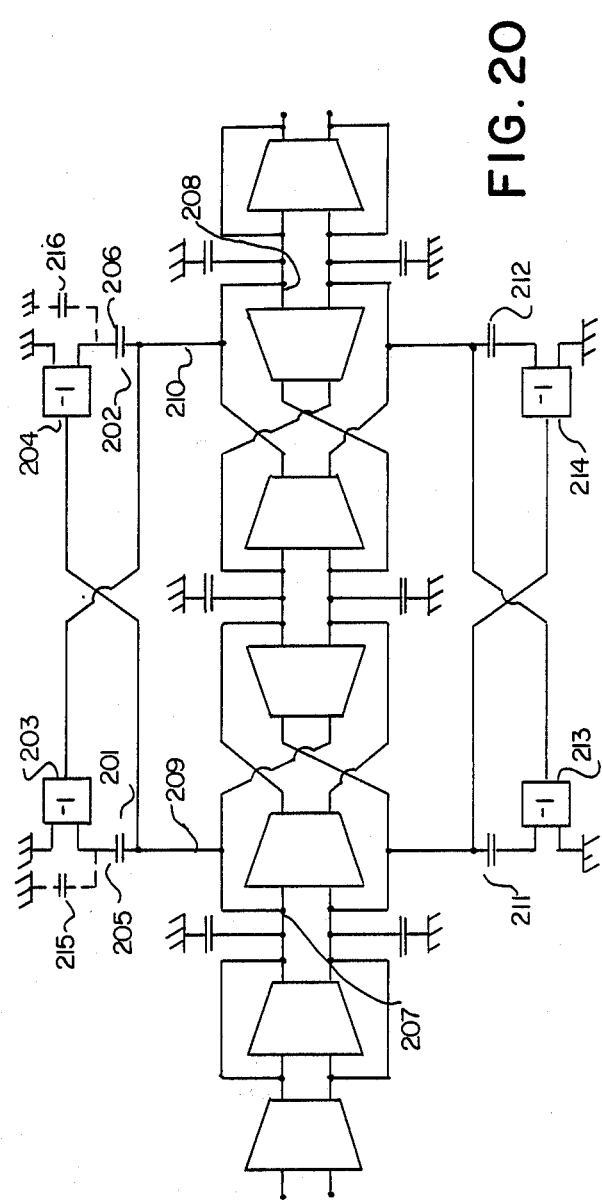

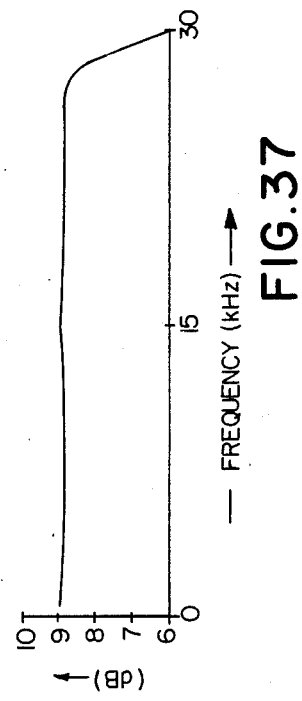
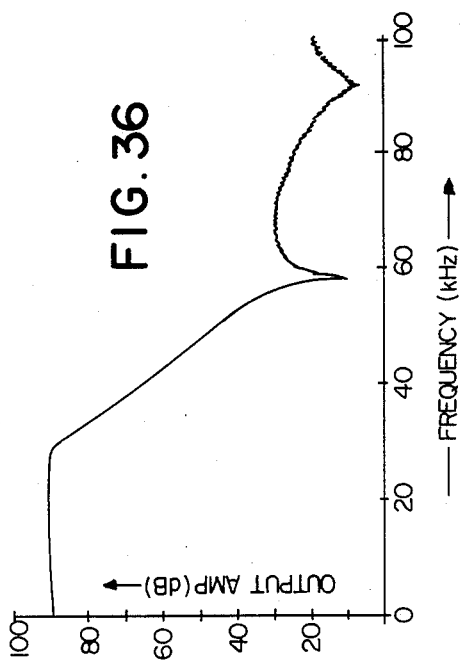
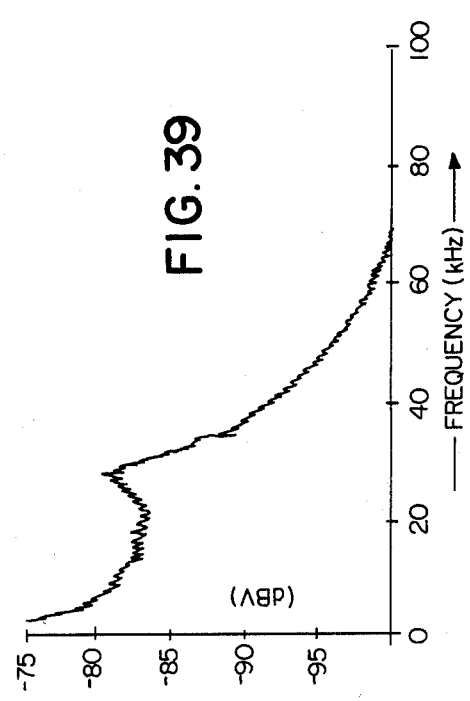
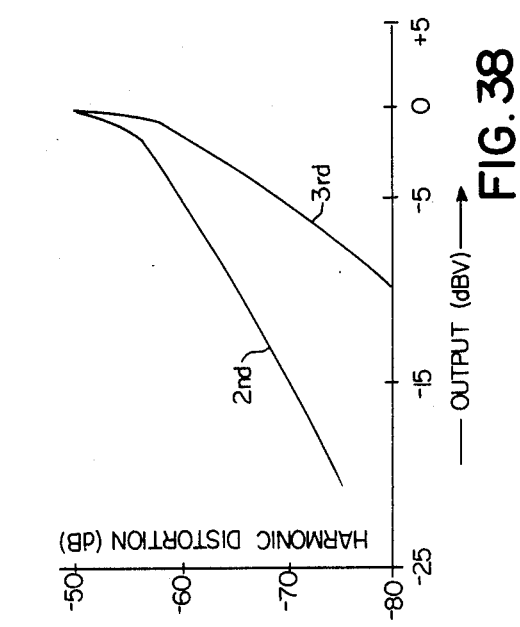

MOS TRANSCONDUCTANCE AMPLIFIER FOR ACTIVE FILTERS

IMPROVEMENTS IN OR RELATING TO TRANSCONDUCTORS

The present invention relates to transconductance amplifier stages employing field effect transistors and particularly though not exclusively to active filters including MOST transconductance stages and capacitors, fabricated as monolithic integrated circuits.

Conventional types of RC active filter have the potential to be constructed using integrated circuits technology. This requires that the time constants or RC products of these circuits must be accurately defined, implying that the absolute values of resistance and capacitance should be closely controllable. This is not possible however with the manufacturing tolerances and temperature coefficients typically associated with monolithically integrated components.

Switched capacitor circuits offer one solution to this problem. These give a frequency domain transfer function with shape defined by ratios of capacitors and with the frequency axis scaled by an accurate externally generated clock frequency. However such filters are sampled data in nature and so in general require an anti-aliasing prefilter and a smoothing post-filter to interface satisfactorily with continuous time or asynchronously sampled circuitry. High frequency components of power supply noise and operational amplifier noise can be coupled into the signal path and aliased into the baseband filter output. The multi-phase non-overlapping clock waveforms generally necessary require carefully designed clock generators and buffers. The high frequency components of these waveforms can radiate to interfere with other circuitry. The synthesis of such filters requires special techniques and special purpose circuit simulators.

An alternative circuit concept involves the use of integrated transconductance amplifiers or "transconductors". In combination with on-chip capacitors in appropriate circuit topologies, these have the potential to realise filters with a wide range of frequency responses. The time-constants of such circuitry are defined by the values of transconductance and capacitance. The shape of the frequency response is determined by the ratios of capacitors and by the ratios of transconductances and is thus insensitive to correlated manufacturing variability in the absolute values or to uniform temperature variations. The frequency axis is scaled according to the absolute values of the transconductances and capacitances and so will vary widely with manufacturing tolerances and temperature variations. This variation can be removed however by using a known "master-slave" approach. In this, the transconductance of all the transconductors is controlled to be equal to that of an extra identical transconductor, which is part of a control loop such as a phase-locked loop locked onto an external reference frequency or a feedback loop based on an external reference resistor.

Several such circuits are known, using bipolar technology. However, MOS technology and CMOS in particular has general advantages of a higher packing density, operation at lower current densities, and higher circuit impedances, leading to compact and low-power circuitry. Digital circuitry can also be readily included on the same chip. These considerations have led to improved circuits for MOS transconductors, particularly in CMOS, though the invention is also thought to be applicable to other similar technologies, including but not exclusively single channel MOS, JFET or MESFETS.

MOS long-tailed pair circuits have been suggested for use as transconductance stages, but even when extra circuitry is added these suffer from limited signal range and non-linear distortion, particularly when the variations of bias point with manufacturing tolerances and temperature are taken into account. Fullydifferential circuitry using a pair of common-source MOSTs, biased to operate in the saturation region of operation, has been suggested, but the transconductance is then dependent on common mode input signals and even a differential input signal component gives rise to a large common-mode output current, placing stringent requirements on the common-mode performance of the circuitry. The use of MOSTs in the triode region to act as voltage-controlled resistors has been suggested, but again the resistance is strongly dependent on common-mode signal voltage.

One aim of the present invention is to provide a differential-input differential-output transconductance stage with low distortion and adequate signal swing, low common-mode output current and with a transconductance set by an external control terminal but independent of common-mode signal voltages. This transconductor can then be used with capacitors connected in appropriate networks such as described below to implement a filter. It could also be used in other known circuit configurations.

The invention comprises a differential input transconductor including a pair of field-effect transistors, wherein:

the source terminals are connected together to a fixed voltage, the substrate terminals are also connected together, to a second fixed voltage, possibly but not necessarily to the same voltage as the source terminals, the quiescent voltages of the gate terminals are equal and signal voltages of equal amplitude but opposite polarity are superimposed on these terminals, and the drain voltages of the two FETs are equal and are set at an appropriate voltage to keep the transistors in the triode region of operation for the expected variation of gate source voltage.

As shown below, the output currents flowing though the drain terminals will comprise a common-mode component, largely independent of input signal voltage and a differential component proportional to the input signal and with magnitude also controlled by the drain-source voltage, but largely independent of the input common-mode voltage.

In the design of a useful transconductance stage, extra circuitry is in general necessary to maintain the drain terminals at constant voltage and to transmit the differential-mode output current component at a higher impedance level to the load circuitry. This additional output circuitry can be a common-gate MOS stage or a common-base bipolar transistor. For minimum distortion, however, more complex circuitry is necessary as described below.

Practical circuits also require common-mode bias stabilisation, and circuits to perform this function have been devised. A suitable control loop circuit has also been derived to stabilise the transconductance with respect to an external resistor to compensate for the effects of temperature and manufacturing tolerances on the transconductance of the transconductor.

For best performance the transistors should be well-matched in geometry and electrical parameters, but the invention is tolerant of small device mismatches.

Transconductors in accordance with the invention can be incorporated into a network of capacitors to realise filters and various examples of such filters are described below. Simple circuit topologies have been designed to implement equivalents of LC ladder filters, both all-pole and with transmission zeros. Variants of these filters use either floating or grounded capacitors, and implement transmission zeros either with floating capacitors or through pairs of capacitors connected to low-impedance nodes.

The invention will now be described by way of example only with reference to accompanying drawings of which:

FIG. 1 is a circuit diagram illustrating the current-voltage relationships for an N channel MOST;

FIG. 2 shows a fully differential transconductor circuit having two N channel MOSTs to illustrate the present invention;

FIGS. 3 and 4 show half-circuit modifications to FIG. 2 to maintain the drain-source voltage difference of the MOSTs;

FIG. 19 shows a transconductor circuit derived from the FIG. 18 prototype;

FIG. 20 shows a modification of the FIG. 19 circuit to reduce the effect of parasitic capacitances;

FIGS. 36 to 39 show performance graphs obtained using a filter circuit broadly as shown in FIG. 35.

Figure 5:
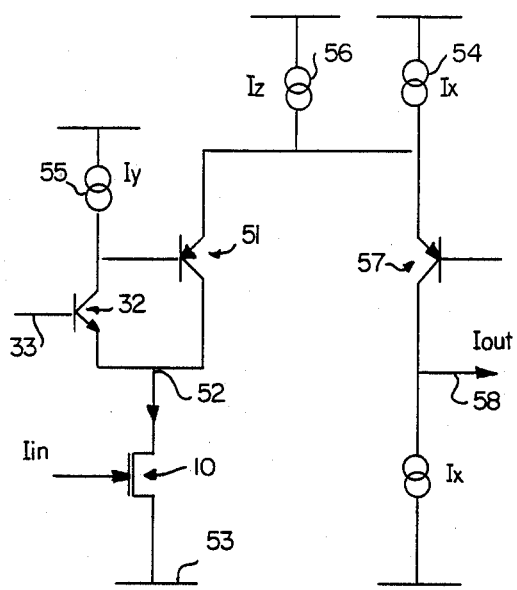
FIG. 5 shows a further modification to the half-circuit of FIG. 4.

The basic principle behind the invention will now be explained with reference to FIG. 1, illustrating an N channel MOST. Reference numerals 11–13 refer respectively to the source, gate and drain of a MOST 10. The usual first-order equation for the drain current of an MOS transistor biased in its triode region of operation is $$\text{Ids} = k' (W/L) [\text{Vgs-Vt}) - \text{Vds}/2]\text{Vds} \tag{1}$$

where:
Ids is the current flowing into the drain terminal;
k' is a process-dependent constant;
W is the transistor width;
L is the transistor length;
Vgs is the applied gate-source voltage;
Vt is the gate threshold voltage; and
Vds is the applied drain source voltage.

This equation is valid for Vgs > Vds + Vt. If Vds is held constant while Vgs is increased from a quiescent value of Vgso to (Vgso+ΔVgs), a change in drain current is predicted, from the quiescent value Idso to (Idso+ΔIds) where the incremental increase ΔIds is given by:

$$\Delta\text{Ids} = k' (W/L) \text{Vds} \Delta \text{Vgs} \tag{2}$$

This implies a perfectly linear transconductance G given by:

$$G = k' (W/L) \text{Vds} \tag{3}$$

From observations of actual device characteristics however, k' is found to vary significantly with Vgs. A commonly-used empirical approximation of this dependence is given by:

$$k' = ko'/[1 + \theta(\text{Vgs} - \text{Vt})] \tag{4}$$

with θ typically between 0.03 and 0.20 per volt, the value of θ varying with process details and device geometry. The effect is usually ascribed to mobility degradation due to increased electric field normal to the channel. This variation in k' with Vgs causes a similarly large variation in the observed transconductance, as is shown by the following analysis.

Substituting for k' in eqn (1) from eqn (4), and letting Vgs=Vgso+ΔVgs and Ids=Idso+ΔIds, we obtain:

$$Ids = \left\{ \frac{k_o' \; Vds}{1 + \theta(Vgso - Vt + \Delta \; Vgs)} \right\} \frac{W}{L} \; (Vgso - Vt + \Delta \; Vgs - \tfrac{1}{2} Vds) \quad (5)$$

Further, substituting $$Go = k_o' \frac{W}{L} \; \frac{Vds(1 + \theta \; Vds/2)}{(1 + \theta(Vgso - Vt))^2} \quad (6)$$

this equation may be re-written $$\begin{aligned}
Ids &= \frac{Go \; (1 + \theta(Vgso - Vt))^2}{1 + \theta \; Vds/2} \; \frac{(Vgso - Vt + \Delta \; Vgs - Vds/2)}{1 + \theta(Vgso - Vt + \Delta \; Vgs)} \\
&= \frac{Go}{\theta} \left\{ \frac{1}{1 + \theta Vds/2} - \frac{1}{1 + \theta(Vgso - Vt + \Delta \; Vgs)} \right\} (1 + \theta(Vgso - Vt))^2 \\
&= \frac{Go}{\theta'} \left\{ \frac{1 + \theta(Vgso - Vt)}{1 + \theta Vds/2} - \frac{1}{1 + \theta' \; \Delta \; Vgs} \right\}
\end{aligned}$$

where $\theta' = \theta/1 + \theta(Vgso - Vt)$ (10)

Hence $\Delta Ids = Ids - Idso$ (11)

$$\begin{aligned}
&= \frac{Go}{\theta'} \left( 1 - \frac{1}{1 + \theta' \; \Delta \; Vgs} \right) \\
&= \frac{Go}{1 + \theta' \; \Delta \; Vgs} \cdot \Delta Vgs
\end{aligned}$$

For typical values of $\theta'=0.1$ and $\Delta Vgs=1V$, this gives a 10% degration in large signal transconductance $G=\Delta Ids/\Delta Vgs$. This is an unacceptable non-linearity for most applications.

The key to reducing this non-linearity is the adoption of a fully differential circuit as shown in FIG. 2, comprising a pair of identical MOS transistors, having the same reference numerals as in FIG. 1. The sources 11 are connected together to a fixed voltage 14 (taken as ground in this analysis) with their substrate terminals also connected together to a fixed voltage (also taken as ground in this analysis). The voltages at the drains 13 are maintained at equal and constant voltage by extra circuitry (not shown for the sake of simplicity), and the input signal ΔVgs is shared equally between the two gates 12.

Defining the drain current of transistor 1 as Ids1=Idso+ΔIds1 and the drain current of transistor 2 as Ids2=Idso+ΔIds2, and following a similar analysis to that resulting in eqn (13):

$$\Delta Ids1 = \frac{Go}{1 + \theta'(\Delta \; Vgs/2)} \cdot \frac{\Delta \; Vgs}{2} \quad (14)$$

$$\Delta Ids2 = \frac{Go}{1 + \theta'(-\Delta \; Vgs/2)} \cdot \frac{-\Delta \; Vgs}{2} \quad (15)$$

So the differential output current ΔIds=ΔIds1−ΔIds2 is given by $$\Delta Ids = \frac{Go \; \Delta \; Vgs}{1 - (\theta' \; \Delta \; Vgs/2)^2} \quad (16)$$

Taking ΔVgs=1V and $\theta'=0.1$ as above, the deviation in large signal transconductance is now an increase of only 0.25%.

Other goals were a low common-mode output current resulting from a differential input and a low sensitivity of differential-mode transconductance to any common-mode signal voltage. The common-mode output current caused by differential inputs +ΔVgs/2 and −ΔVgs/2 is $$\begin{aligned}
|(\Delta Ids1 + \Delta Ids2)/2| &= \frac{Go\theta' \; \Delta \; Vgs^2}{4(1 - (\theta' \; Vgs/2)^2)} \\
&= G \cdot \frac{\theta' \; \Delta \; Vgs^2}{4}
\end{aligned}$$

For the example of $\theta'=0.1$ and ΔVgs of 1V this is G/40. The resulting output common-mode voltage will be an even smaller fraction of the output differential-mode voltage if the common mode output impedance is designed to be smaller than the differentialmode output impedance, as in the integrated CMOS designs presented below.

The variation in differential-mode conductance G for any residual common-mode signal or from any common-mode voltage offset due to transistor mismatching, ΔVgso may be obtained by substituting for Go in eqn (13) from eqn (6) and differentiating to give $$|dG/dVgso| = \frac{d}{dVgso} ko' \frac{W}{2} Vds(1 + \theta Vds/2)\left(\frac{1}{(1 + \theta(Vgso - Vt))^2 - \theta^2 \Delta Vgs^2/4}\right)$$

$$\approx \frac{ko'W}{L} Vds(1 + \theta Vds/2)\left\{\frac{d}{dVgso}[1 - 2\theta(Vgso - Vt)]\right\}$$

$$\approx G \cdot 2\theta$$

So even for a common-mode offset as large as 25 mV (=1V/40), the large-signal transconductance will be modulated by only 2.0/40=0.5%.

For best performance the transistors should be well-matched in geometry and electrical parameters, but the invention is tolerant of small device mismatches.

The output conductance of the above circuit is equal to the drain-source conductance of the transistors, typically of the same order as the transconductance. To prevent appreciable modulation of Vds by the output current variations, which would modulate the transconductance and introduce non-linearity, the transistor drains need to drive into a low-impedance load. Also, in general, for a transconductance amplifier to be useful in circuit applications, its output impedance needs to be at least an order of magnitude greater than the transconductance. Thus an output buffer transresistance stage needs to be added to the pair of transistors to realise a useful circuit element.

In principle, as shown in the half-circuits of FIGS. 3 and 4, a simple common-gate MOS stage 31 (FIG. 3) or common-base bipolar stage 32 (FIG. 4) could be used. However such a stage has a maximum input conductance of the order of I/(kT/q) and has limited output impedance.

FIG. 5 shows a transconductor half-circuit using a preferred output stage, which operates as follows.

In the quiescent state, the current through voltage-controlled current source 54 and transistor 57 is Ix, the current through current source 56 and transistor 51 is Iz, the current through current source 55 and transistor 32 is Iy, and the current through the input transistor 10 is Iz+Iy. The voltage control terminal 33 is set such that the drain-source voltage between node 52 and ground 53 is low enough to bias transistor 10 in its linear, or triode, region. The input signal voltage, IP+, to this half-circuit is superimposed on the gate voltage of transistor 10. A positive incremental input signal voltage will cause an increase in drain current in transistor 10 and will tend to cause the voltage of node 52 to decrease. This will increase the collector current of transistor 32 and cause a larger drop in the base voltage of transistor 51. In conjunction with transistor 57, this causes an increase in current through transistor 51, which will steer the incremental current away from transistor 32. An equal but opposite incremental current will flow through transistor 57, causing the signal current originally induced in transistor 10 to appear at the output terminal 58.

In this way, the input impedance seen by the drain of transistor 10 is reduced below that of common-base transistor 32 by a factor equal to the loop gain of transistors 32 and 51, so that node 52 is maintained at a constant voltage for a wide range of input voltages. The output impedance is also increased over that of transistor 32 by the folded-cascode action of transistor 57.

The full transconductor would include two such half-circuits, driven by a pair of complementary input signals IP+ and IP−. From the above analysis this fully-differential transconductor element would have a linear transfer function and a high output impedance, as desired.

Figure 6A:
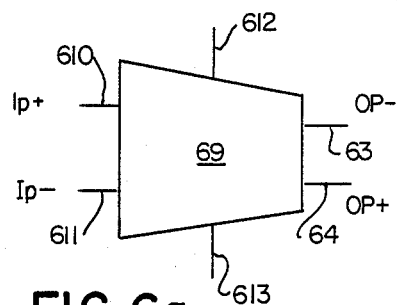
FIGS. 6a and 6b shows a schematic representation and a detailed circuit diagram of a transconductor using discrete components.
Figure 22:
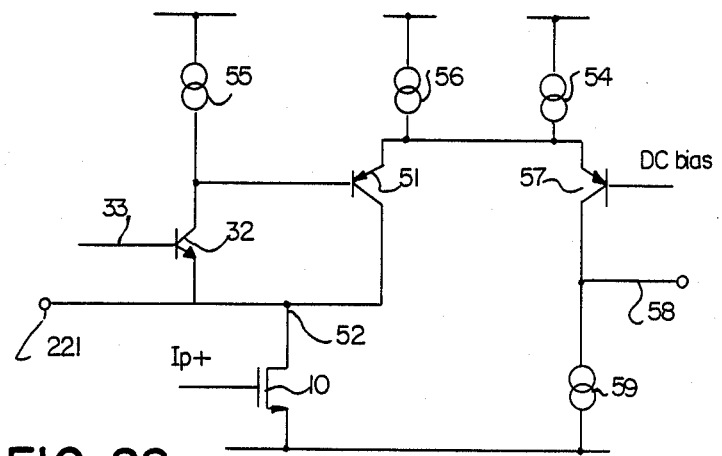
FIG. 22 shows a modification of the FIG. 5 transconductor half-circuit incorporating the current amplifier function of FIG. 20.

FIG. 6a shows a symbolised transconductor 69 having complementary differential inputs 610 and 611 and differential outputs 63 and 64. Optional additional complementary inputs are indicated by terminals 612 and 613. The purpose of these inputs is explained later with reference to FIG. 22.

Figure 6B:
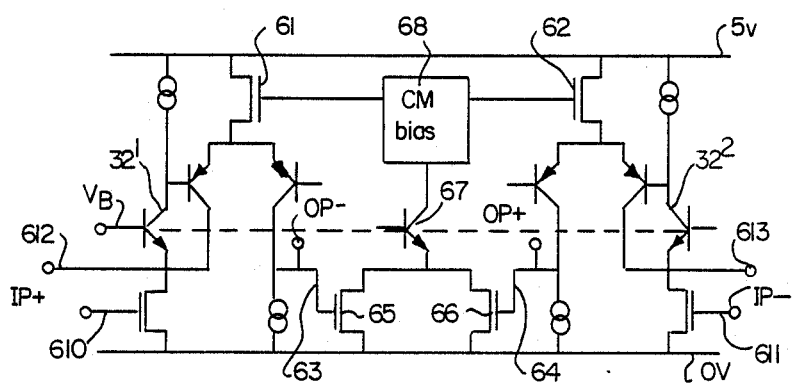

FIG. 6b shows the circuit diagram of a transconductor designed and constructed using discrete components. The components used were standard parts as illustrated, except for the MOS transistors, which were test devices from a 2.5 μm CMOS process.

Figure 7:
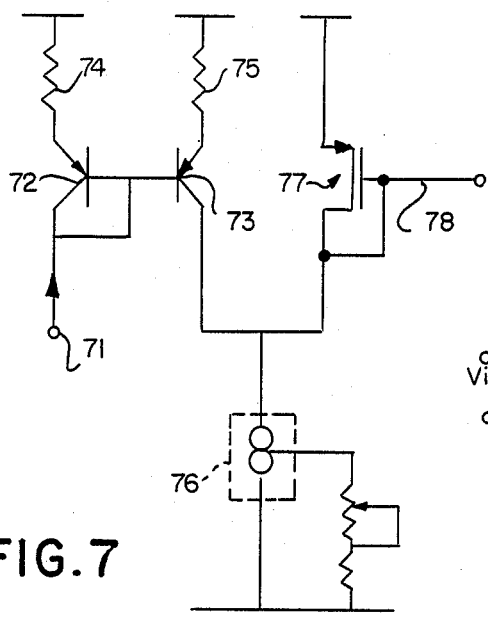
FIG. 7 shows in detail the common mode (CM) bias stage of FIG. 6b.

The circuit includes two half-circuits similar to FIG. 5, but with the current sources 54 and 56 implemented using MOS transistors 61 in one half-circuit and 62 in the other. Extra circuitry is included to stabilise the common-mode output voltage and to reduce the common-mode output impedance as follows. The output terminals 63 and 64 are connected to the gates of MOS transistors 65 and 66 which are biased in the triode region by bias voltage VB applied to the base of bipolar transistor 67. This causes a current through the collector of transistor 67. To first order, this current is independent of the output differential voltage appearing between terminals 63 and 64 but increases linearly with the common-mode voltage of these terminals. This current is transmitted to the CM bias stage 68, which is shown in more detail in FIG. 7. The current from the collector of transistor 67 (FIG. 6b) appears at terminal 71 where it passes through a current mirror comprising transistors 72, 73 and emitter degeneration resistors 74, 75. The difference between this current and the current set by the bias of current source 76 passes through a drain-gate connected MOST 77. The resulting voltage appearing at terminal 78 is used to drive the gates of similar MOSTs 61, 62 (FIG. 6b), which are matched devices and so will give equal currents. In this way, any increase in common-mode output voltage at nodes 63, 64 causes an increase in collector current in transistors 67, 72 and 73, which in turn results in a decrease in current in MOSTs 77, 61 and 62, which will act to restore the common-mode voltage at terminals 63, 64 without changing any differential-mode output voltage. The value of this common-mode output voltage is adjustable by means of the current source 76.

Figure 8:
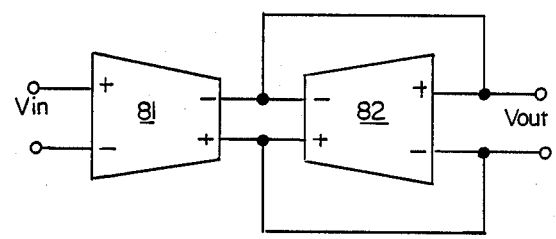
FIG. 8 is a block diagram of a voltage controlled current source circuit using a transconductor.
Figure 9:
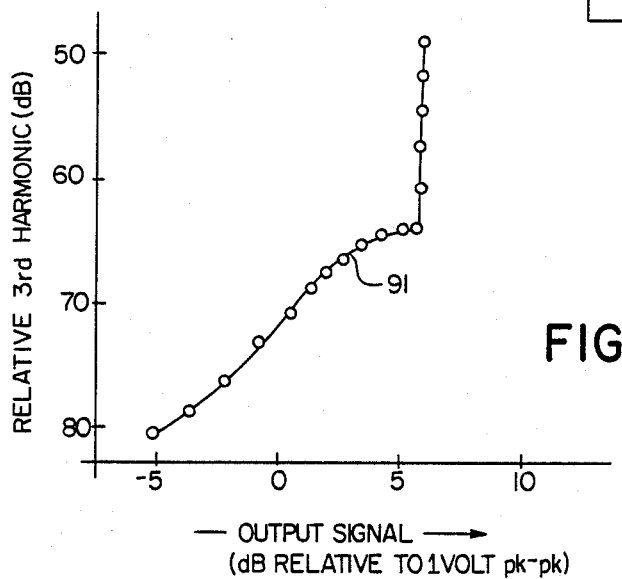
FIG. 9 is a graph of the variation of 3rd harmonic distortion with output signal level for the FIG. 8 circuit.

Various circuits have been built and investigated using such transconductors. The simple circuit of FIG. 8 comprises an input transcondutor 81 acting as a voltage-controlled current source feeding into a second transconductor 82 with inputs and outputs connected to simulate a resistive load. With the bias voltage (FIG. 6b) VB set at 1.1V, a transconductance of 210 μA/V was obtained. The observed third harmonic distortion of the output signal is shown by curve 91 in FIG. 9, plotted against output signal level. With an output level of 1V peak-to-peak, output distortion is 73dB below the fundamental, and reduces by 12dB per 6dB drop in signal level.

Figure 10:
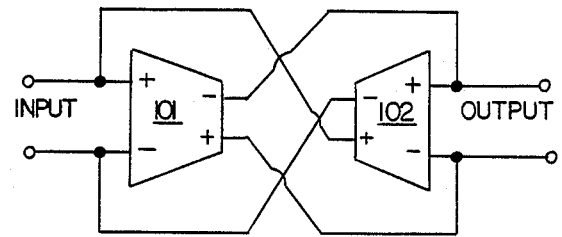
FIG. 10 is a block diagram of a gyrator including two transconductors.
Figure 11:
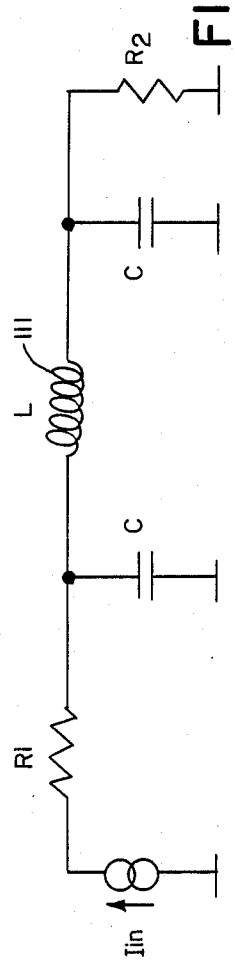
FIG. 11 shows a conventional LC ladder prototype for a 3rd order 0.1 dB Chebyshev filter circuit.
Figure 12:
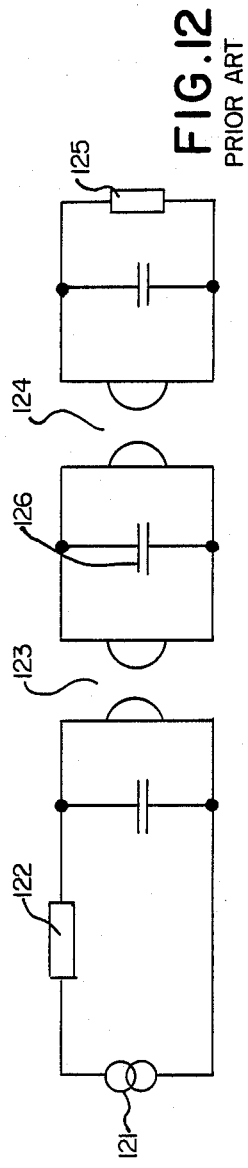
FIG. 12 shows the circuit of FIG. 7 with the inductors replaced by gyrators and grounded capacitors.
Figure 13:
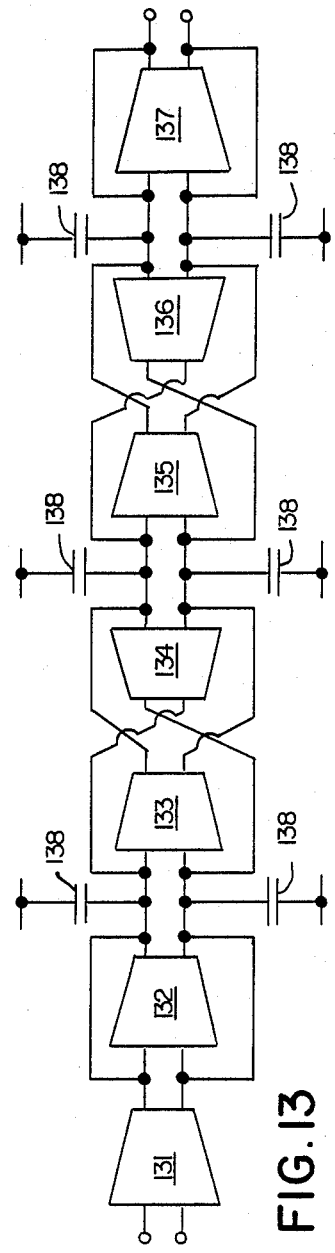
FIG. 13 shows the FIG. 12 circuit with the gyrators replaced by transconductors.

An example of the use of such a transconductor is in active filters. It is known that a gyrator can be realised using a pair of voltage-controlled current sources. FIG. 10 shows a pair of transconductors 101 and 102 interconnected to act as a differential-input differential-output gyrator. Starting from a standard LC ladder prototype such as shown in FIG. 11, known techniques are used to replace the inductor(s) 111 by gyrators and grounded capacitors, to give the circuit of FIG. 12, where 123 and 124 are gyrators. Converting this circuit to a fully-differential equivalent and replacing the gyrators by pairs of transconductors, gives the circuit of FIG. 13.

The input transconductor 131, replacing the voltage-controlled current-source 121, feeds into a second transconductor 132 with inputs and outputs interconnected to simulate the resistive load 122. Transconductors 133, 134 and 135, 136 replace the gyrators 123, 124 and transconductor 137 with inputs and outputs interconnected simulates the output termination resistance 125.

Figure 14:
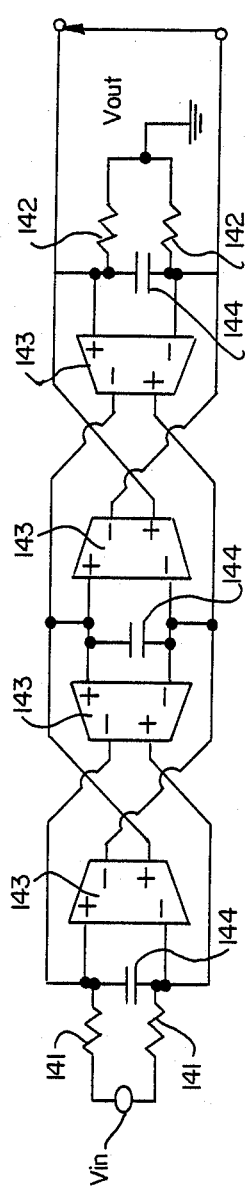
FIG. 14 shows the Chebyshev filter using transconductors.
Figure 15B:
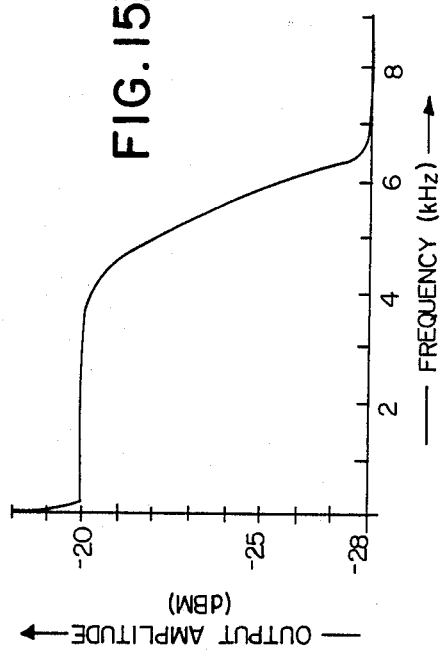
FIGS. 15a and 15b are graphs of the measured frequency response of the FIG. 14 filter.
Figure 15A:
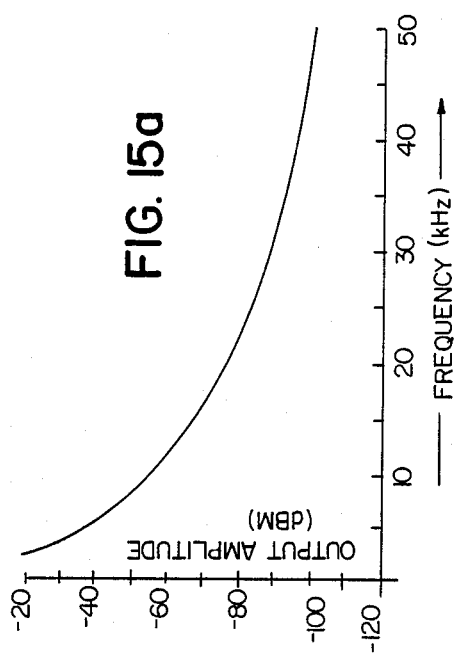
Figure 17:
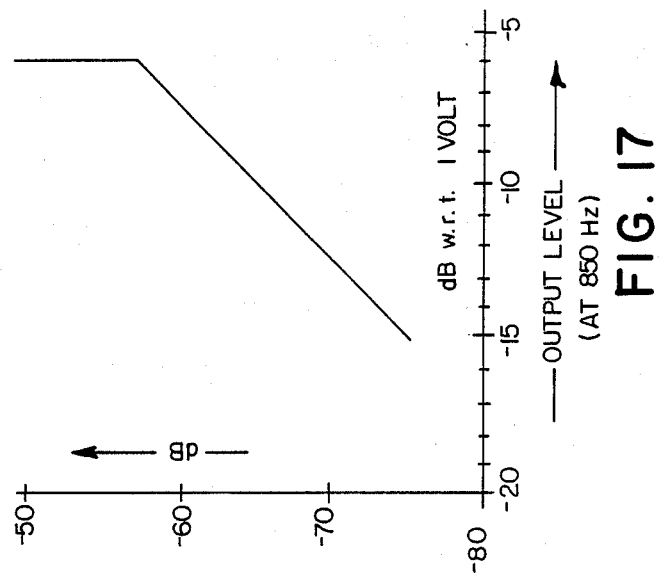
FIG. 17 shows the harmonic distortion against signal amplitude at 850 Hz for the FIG. 14 filter.
Figure 16:
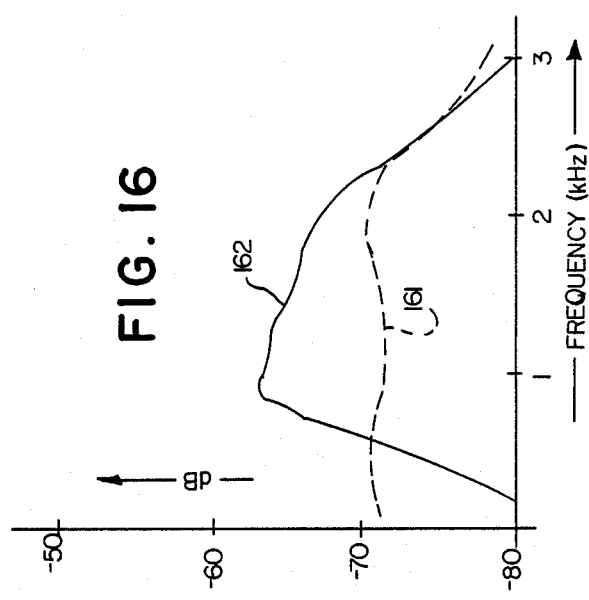
FIG. 16 shows graphs illustrating the frequency variation of the harmonic distortion of the FIG. 14 filter.

Complete filters of this type have been constructed using transconductors of the type shown in FIG. 6a. FIG. 14 shows a 3rd order 0.1dB Chebyshev ladder-based filter. In this circuit the capacitors 144 are floating, connected across the differential inputs, in place of the pairs of grounded capacitors 138 in FIG. 13. This reduces the total capacitance by a factor of four. The stop-band and pass-band frequency responses of the circuit of FIG. 14 are shown in FIGS. 15a and 15b respectively. The harmonic distortion of the second harmonic (161) and the third harmonic (162) varies with frequency, as shown in FIG. 16. At the worst-case frequency of 850 Hz, the peak of the third harmonic distortion is increased for a given output level by the voltage amplification at the internal nodes and by the four transconductors 143 each contributing to the distortion. Even so, only 63dB of third harmonic distortion is apparent at an output of 1V peak-to-peak. Note that resistors 141, 142 were used for the terminations instead of transconductors to reduce the complexity of this prototype filter. The results of FIG. 9 imply that the use of additional transconductors to realise these input and output terminations would not drastically affect the distortion of this circuit.

Figure 18:
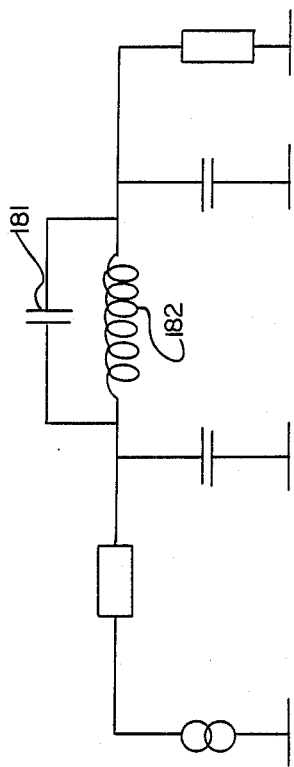
FIG. 18 shows an LC prototype circuit which is a modification of the FIG. 11 prototype.

Filters with transmission zeros such as elliptic filters can also be realised with simple circuit topologies using transconductors. For example adding a capacitor 181 to the all-pole LC ladder prototype of FIG. 11 gives an LC ladder prototype as shown in FIG. 18 which realises a transmission zero. As before, by replacing the inductor 182 by the gyrator-capacitor equivalent, converting to a fully-differential topology, and then replacing the gyrators by transconductor pairs, this gives the circuit of FIG. 19, which is similar to FIG. 13 but contains extra capacitors 191, 192.

This circuit could be used to implement an integrated filter. However, capacitors fabricated in integrated circuit technology have associated parasitic capacitances to ground, typically of the order of 10 percent of their inter-electrode capacitance and associated mainly with one of the two electrodes. If this value could be predicted, its effect on the frequency response could be directly compensated by alteration of the nominal value of the grounded capacitors connected to the same node. In general, however, these parasitics are subject to uncorrelated variations with fabrication tolerances and vary with temperature and voltage causing non-linearity and frequency response deviation and drift.

FIG. 20 shows the circuit of FIG. 19 modified to reduce the effect of these parasitic capacitances. Capacitor 191, value Cx is replaced by the pair of equal capacitors 201, 202, value Cx and associated current amplifiers 203, 204. These current amplifier stages have a low input impedance and so plates 205, 206 of capacitors 201, 202 connected to the amplifier inputs are effectively grounded, eliminating the effect of any parasitics 215, 216 to ground on these plates. Also, the current flowing out of node 207 with voltage V1+ and into node 208 with voltage V3+ through wires 209 and 210 respectively is equal to s.Cx.(V1+ −V3+). This is exactly equal to the current flowing through the terminals of capacitor 191 in the circuit of FIG. 19. Similarly capacitor 192 of FIG. 19 is replaced by an exact equivalent network comprising capacitors 211, 212 and current amplifiers 213, 214.

Figure 21:
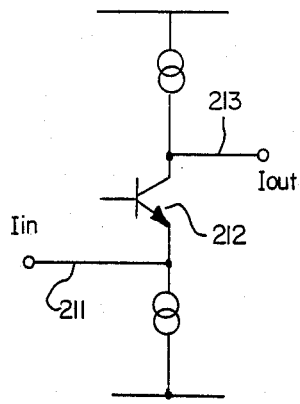
FIG. 21 is a form of current amplifier suitable for use in the FIG. 20 circuit.

These current amplifiers could be realised as simple commonbase stages such as shown in FIG. 21, in which an increase in current flowing into node 211 will decrease the current through transistor 212 and thus give an equal increase in the current flowing out of node 213.

However, a simpler complete filter circuit results from incorporating this function in the transconductors as follows. Adding an extra terminal 221 to each transconductor half-circuit of FIG. 5 gives the circuit of FIG. 22. Node 52 is a low-impedance point and any current injected into the terminal 221 will have the same effect as an increase in the current of the input MOST 10, appearing at the output terminal 58 at a higher impedance and appropriate polarity. The function of the current amplifiers can thus be incorporated in the transconductor circuits with no extra active components.

Figure 23:
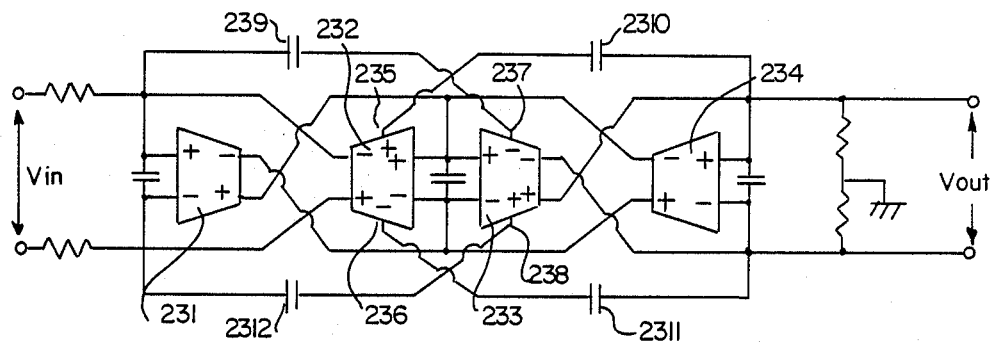
FIG. 23 shows an elliptic filter derived from the FIG. 14 Chebyshev filter.
Figure 24:
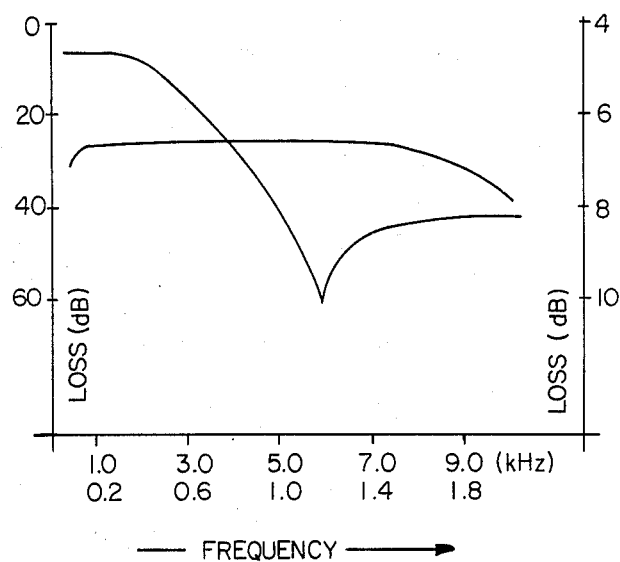
FIG. 24 is a graph of the measured frequency response of the 3rd order LP filter shown in FIG. 23.
Figure 25:
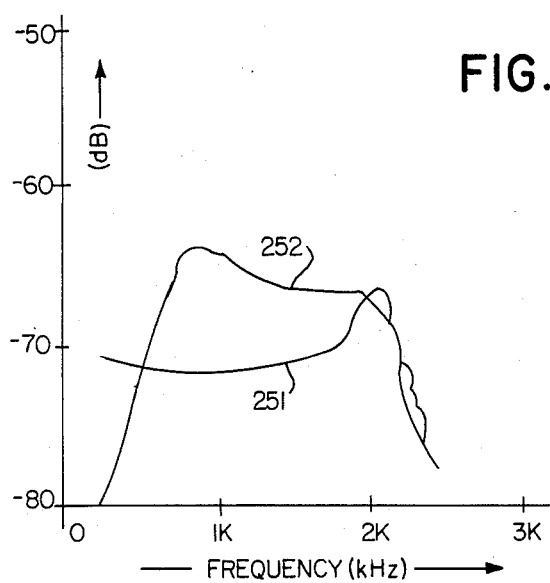
FIG. 25 shows graphs illustrating the frequency variation of the harmonic distortion of the FIG. 23 filter.

FIG. 23 shows the all-pole prototype filter of FIG. 14 modified to include transmission zeros in the way just described, to implement a 0.1dB Cauer filter. The filter has four transconductors 231–234 of which two, 232 and 233, have extra terminals 235–238. Capacitors 239–2312 are connected between respective inputs to transconductors 231, 234 and the opposed polarity extra terminals of transconductors 233, 232. The capacitors 239–2312 have the same capacitance value Cx. FIG. 24 shows the observed frequency response. FIG. 25 shows the variation with input signal frequency of harmonic distortion at the second harmonic (251) and third harmonic (252). The distortion performance is similar to that observed from the Chebyshev filter as shown in FIG. 16.

Figure 26:
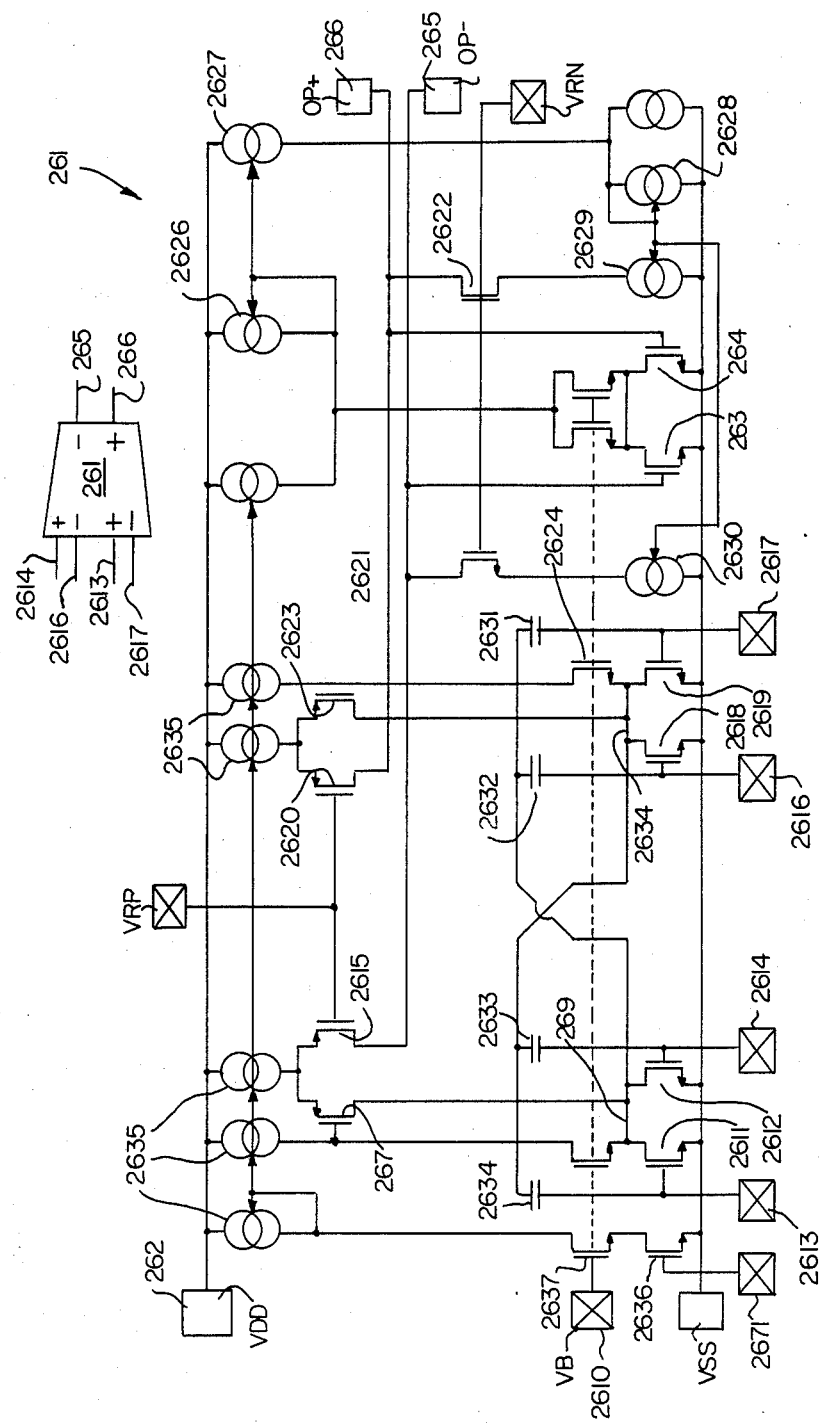
FIG. 26 shows a transconductor fabricated from MOSTs.

The prototype circuits described above used a combination of MOS and bipolar transistors. A fully-integrated design using only n-channel and p-channel MOSTs is possible. FIG. 26 shows the circuit diagram of such a design. This circuit was designed for fabrication in a standard 2.5 μm CMOS process to operate from a single 5V±5% power supply 262 over a range of junction temperatures of from −25 to 80 deg C. and over a typical range of fabrication tolerances. The nominal transconductance is 8.5 μA/V and typical power dissipation is 0.9 mW. Typical open-circuit voltage gain is 940, input signal range 2.5 V±1.05 V, output signal range 2.5 V±0.9 V.

Most nodes in the complete transconductor filter circuits described above are driven from two transconductor outputs. Rather than using two complete and separate transconductors, however, the signal currents from the input MOSTs may be added by connecting both their drains to the same low-impedance node and sharing the output buffer stage, to give the single dual-input transconductor 261. This reduces the component count and gives a higher output impedance.

The fully-integrated design of FIG. 26 is such a circuit, with differential input signals applied between terminals 2614 and 2616 and between terminals 2613 and 2617. MOSTs 268, 267 and 2615 serve the same function as transistors 32, 51 and 57 respectively of the transconductor half-circuit of FIG. 5, as follows. MOST 267 keeps the current through MOST 268 constant and so keeps node 269 at a constant voltage controlled by VB (2610). This drain-source voltage across MOSTs 2611 and 2612 is small enough to keep them in the linear, or triode, region of operation as desired to give a linear transconductance. The total signal current is applied from the MOSTs 2611 and 2612 through folded-cascode MOST 2615 to the output 265. Similarly, inverse signals at terminals 2616 and 2617 are applied to the gates of MOSTs 2618 and 2619 and cause an inverse signal current through MOST 2620.

The common-mode feedback to stabilise the output common-mode voltage differs from that of the prototype transconductor of FIG. 6. The output voltages 265 and 266 are connected to the gates of the parallel triodes 263 and 264 to give a common-mode signal current independent of output differential voltage as before. This current is now reflected and amplified through current mirror 2626, 2627 and is reproduced equally by devices 2630 and 2629, controlled by device 2628, buffered from the output by common-gate MOSTs 2621 and 2622 respectively. The value of the common-mode output voltage is set indirectly by input bias voltage applied to terminal 2671, which sets the value of the current sources 2635, through transistors 2636, 2637.

For application in the filter circuits described above it is important to minimise the phase delay between the input voltage and the output current. Such phase delay will cause the phase delay between the input voltage and output voltage to exceed the 90 degrees expected, when driving a capacitive load to implement an integrator stage. Such "excess phase" can cause large peaking of the filter frequency response near the pass-band edge and is a well-known phenomenon in more conventional active filters.

Figure 26A:
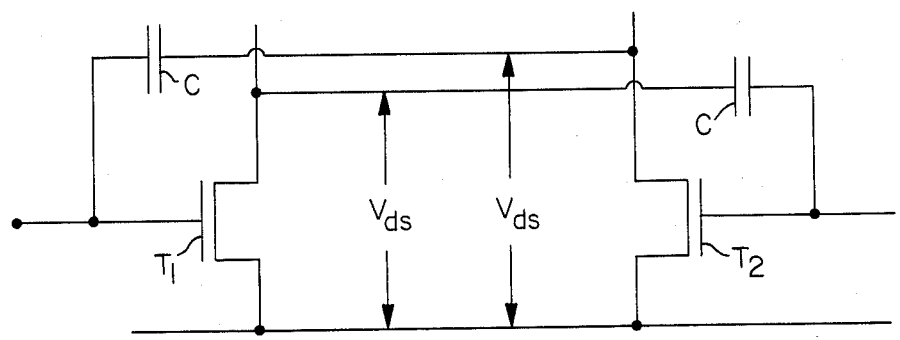
FIG. 26A is a shematic view showing a part of FIG. 26.

To minimise this excess phase, capacitors 2631, 2632, 2633, 2634 have been included. These are connected between the drain terminals 269, 269, 2634, 2634 respectively and the inverse input terminals 2617, 2616, 2614, 2613 respectively. FIG. 26A illustrates the principal of operation of these componants. Each pair of capacitors C is connected between respective gate terminals of a pair of input transistors $T_1$ and $T_2$. In this way a component of signal current which leads the drain current of the input MOSTs is added to the drain current to give the output current. The sizes of these capacitors are chosen such that this leading signal current cancels the lagging component of the input transistor drain current. This technique is similar to the well-known technique of neutralisation used in the design of high-speed bipolar differential amplifier stages. In practice, the capacitors are made larger, so as to also compensate for phase delay through the output stage. For this particular design, the output stage contributes about as much phase delay as the input MOSTs, so the capacitors were double the originally chosen size.

After adjusting the capacitor values to give zero phase lag for nominal parameters at room temperature, the maximum simulated phase deviation over variations of process parameters and temperature is only 0.001 degrees/kHz. This excellent phase stability is due partly to the low temperature coefficients of the capacitors and partly to the stabilisation of the transistors conductances.

Figure 27:
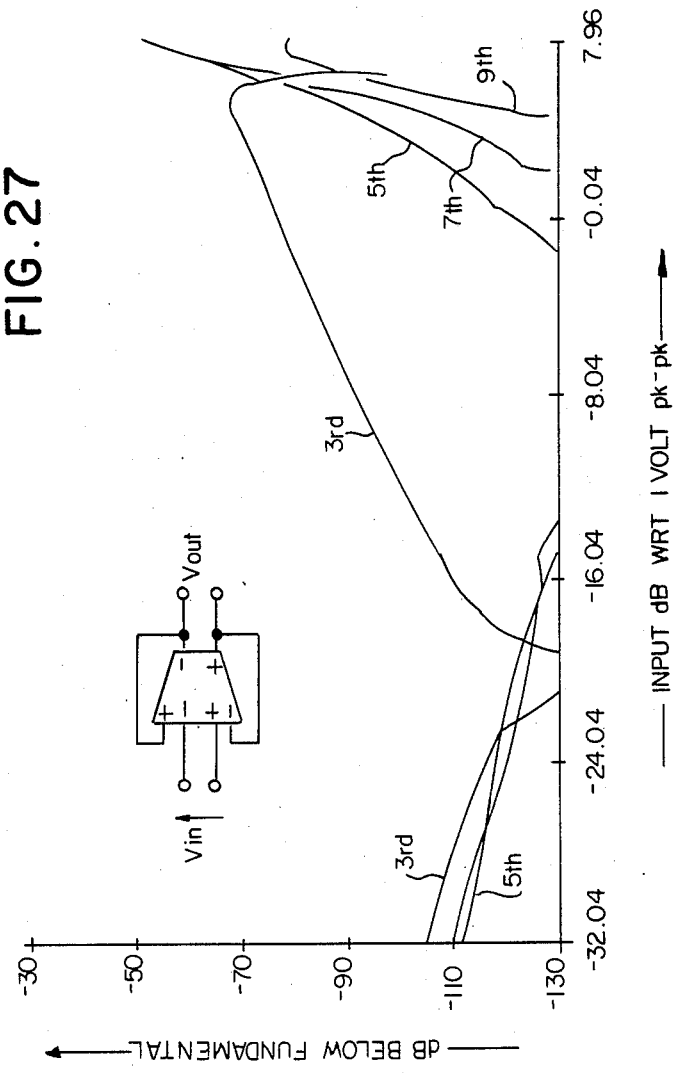
FIG. 27 shows the simulated output harmonic variation of the FIG. 26 transconductor.

FIG. 27 shows the simulated output harmonic distortion of this transconductor design, plotted against input signal amplitude.

Figure 28:
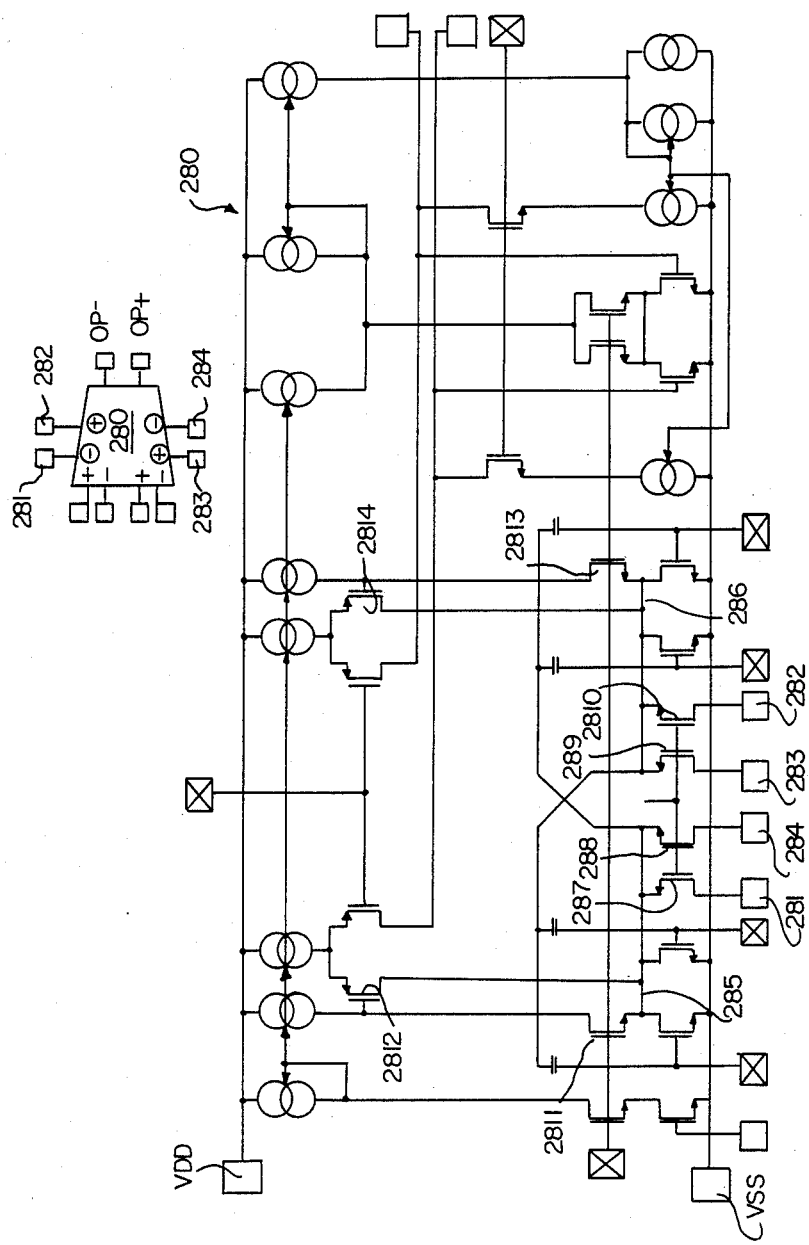
FIG. 28 shows a modified transconductor having additional signal input connectors.

For the complete filter, two variants of this transconductor are necessary. FIG. 28 shows a transconductor 280, identical to the FIG. 26 arrangement but with additional inputs 281–284 to the input transistor drains connected to nodes 285 and 286 to facicitate the implementation of transmission zeros as described above. These connections are buffered through transistors 287–2810 biased in triode region to act as resistors as shown. This is necessary to buffer the nodes 285, 286 from the load capacitance to prevent degradation of the stability of the 2811/2812 and 2813/2814 feedback loops.

The second variant 291 is shown in FIG. 29 and is again similar to the transconductor 261 shown in FIG. 26 except:

a. MOSTs 295/296 and 297/298 are tied together;
b. there is no phase neutralisation, hence capacitors 2631, 2632, 2633, 2634 are omitted; and
c. the common-mode stabilisation circuitry is omitted and replaced by a differential-to-single-sided convertor 299 giving a single output 292.

Figure 30:
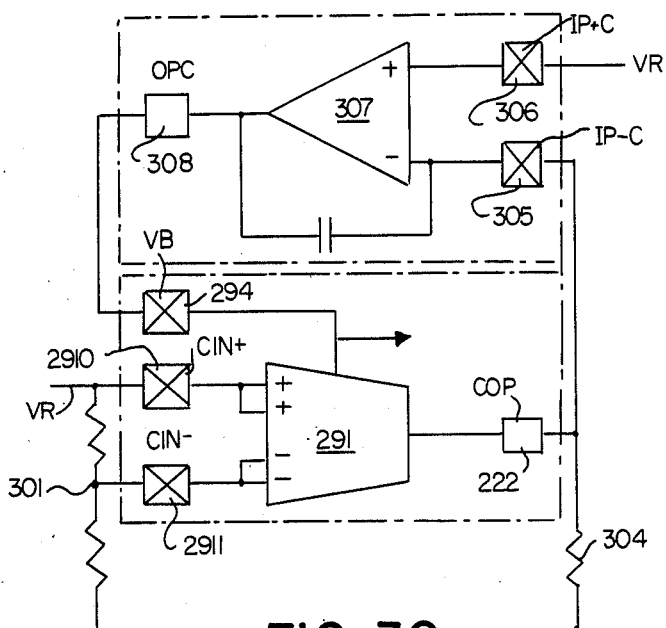
FIG. 30 illustrates a transconductance stabilisation circuit using the FIG. 29 transconductor.

This transconductor variant 291 is used in the control loop shown in FIG. 30 to stabilise the transconductance of itself and of all the other similar transconductor in the filter against process and temperature variations. Since all the transconductors in an integrated filter will be fabricated on the same chip and in close proximity, the tracking of process parameters and temperature will be close, so the transconductances will also track closely.

Figure 29:
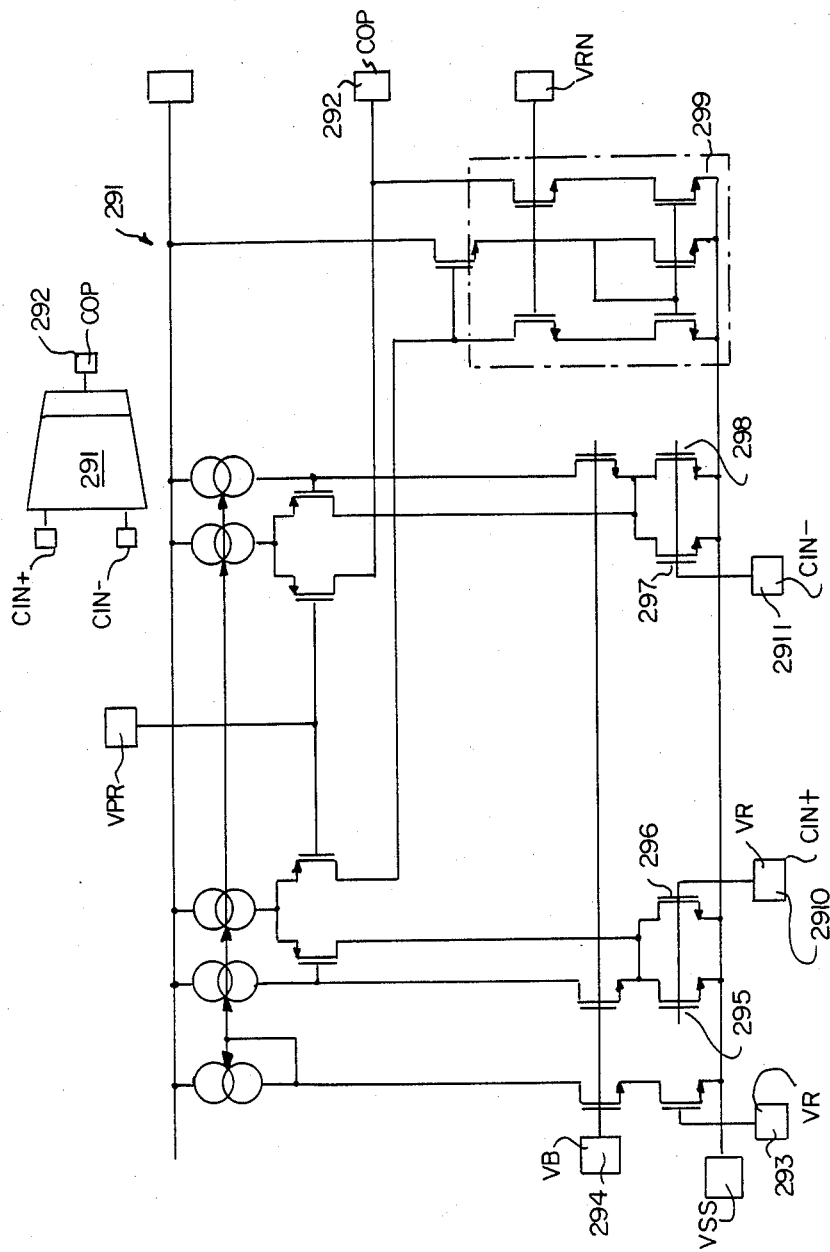
FIG. 29 shows a further modified transconductor having a single sided output.

A voltage VR is applied to 2910 of a transconductor 291. A voltage VR/8 from the resistive potential divider 301 is applied across the inputs 2910, 2911 of a transconductor 291 (FIG. 29). The current from the transconductor 291 is driven through an offchip resistor 304. The voltage developed at the end 305 of this resistor is compared with VR at the pad 306 by an error amplifier 307 which drives the bias voltage VB at pad 308 connected to the input 294 to the transconductor 291, modulating its transconductance and thus closing the feedback loop.

The error amplifier 307 was realised in this case as a simple single-stage folded cascode load-stabilised operational transconductance amplifier using n-channel and p-channel MOSTs (not shown).

The simulated phase margin of this loop remains greater than 82 degrees over anticipated process and temperature variations. The circuit exhibits a simulated offset of 1.5 percent in the transconductance of the slave transconductance cells compared to the reference resistance. This is caused primarily by the single-ended input to the transconductor 291 giving a fall-off in its transconductance, even with the attenuated input voltage of only about 0.3 V. This offset (being stable to 0.1% with temperature,) could be trimmed out by alteration of the reference resistance 304. Random offset voltages of the error amplifier 307 and transconductor 291 will give errors of 0.04%/mV and 0.3%/mV respectively.

Figure 31:
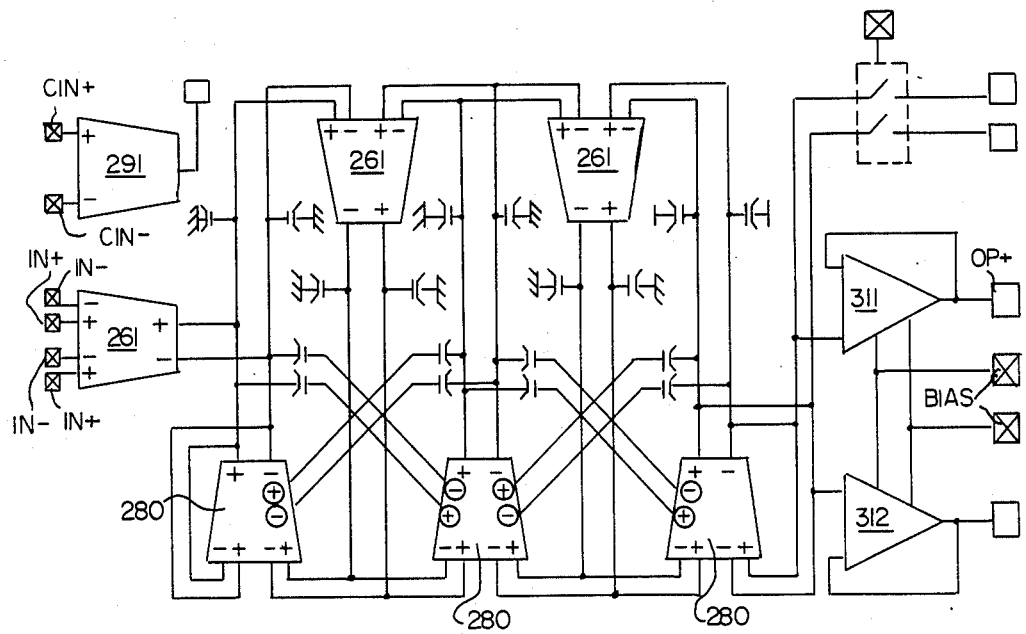
FIG. 31 shows a 5th order elliptic filter using transconductors shown in FIGS. 26, 28 and 29.

The circuit diagram of a complete 5th order elliptic filter based on a doubly terminated LC ladder filter is shown in FIG. 31. This occupies a total chip area of 5.3 mm2 of which the transconductors and capacitors occupy only 2.5 mm2. The simulated typical power dissipation is 15.7 mW including 9.0 mW of the two output voltage-follower op amps 311 and 312. The operational amplifiers 311 and 312 are needed to buffer the high-impedance filter output to drive low-impedance off-chip loads and are also realised by MOST devices (not shown).

Figure 32:
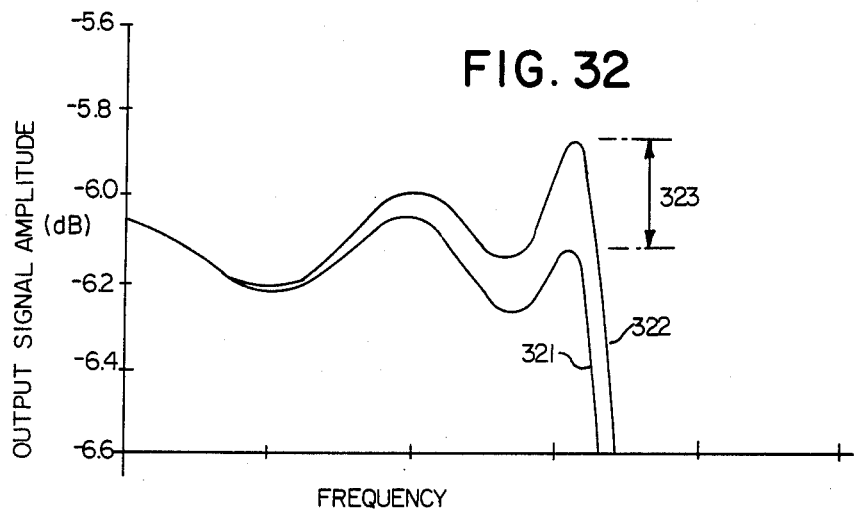
FIG. 32 shows graphs of the frequency response of the FIG. 31 filter, with and without phase neutralisation.
Figure 33:
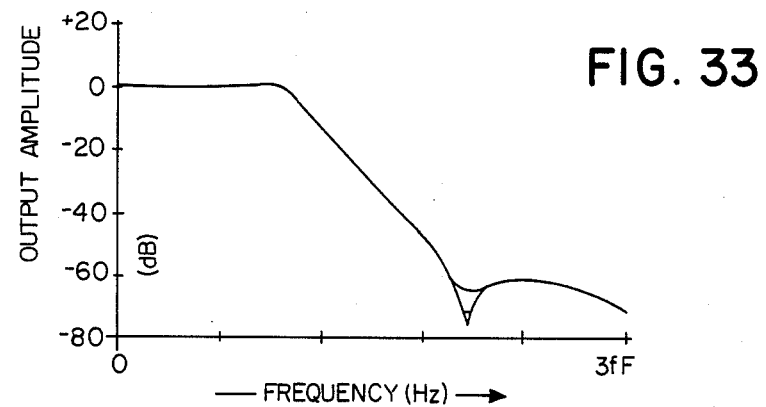
FIG. 33 shows the frequency response of the FIG. 31 filter after tolerancing for process and temperature extremes.
Figure 34:
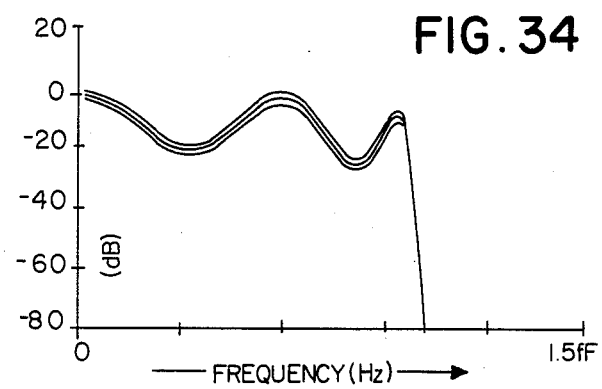
FIG. 34 shows the FIG. 32 responses after tolerancing.

In contrast to switched-capacitor circuits, the entire filter can readily be simulated using a standard circuit simulator such as SPICE, including the effect of all parasitics. Simulated frequency response is shown in FIG. 32, with (321) and without (322) phase neutralisation. The phase neutralisation can be seen to make 0.2dB difference (323) in the passband peaking. Small errors in the neutralisation will thus have a very small effect on pass-band ripple. FIGS. 33 and 34 show the response toleranced over process and temperature extremes. Total simulated output differential noise voltage integrated from 0 to 1.5 fF is typically 175 $\mu$V, giving a 71.1dB dynamic range relative to a 1 v peak-to-peak differential output voltage swing.

Figure 35:
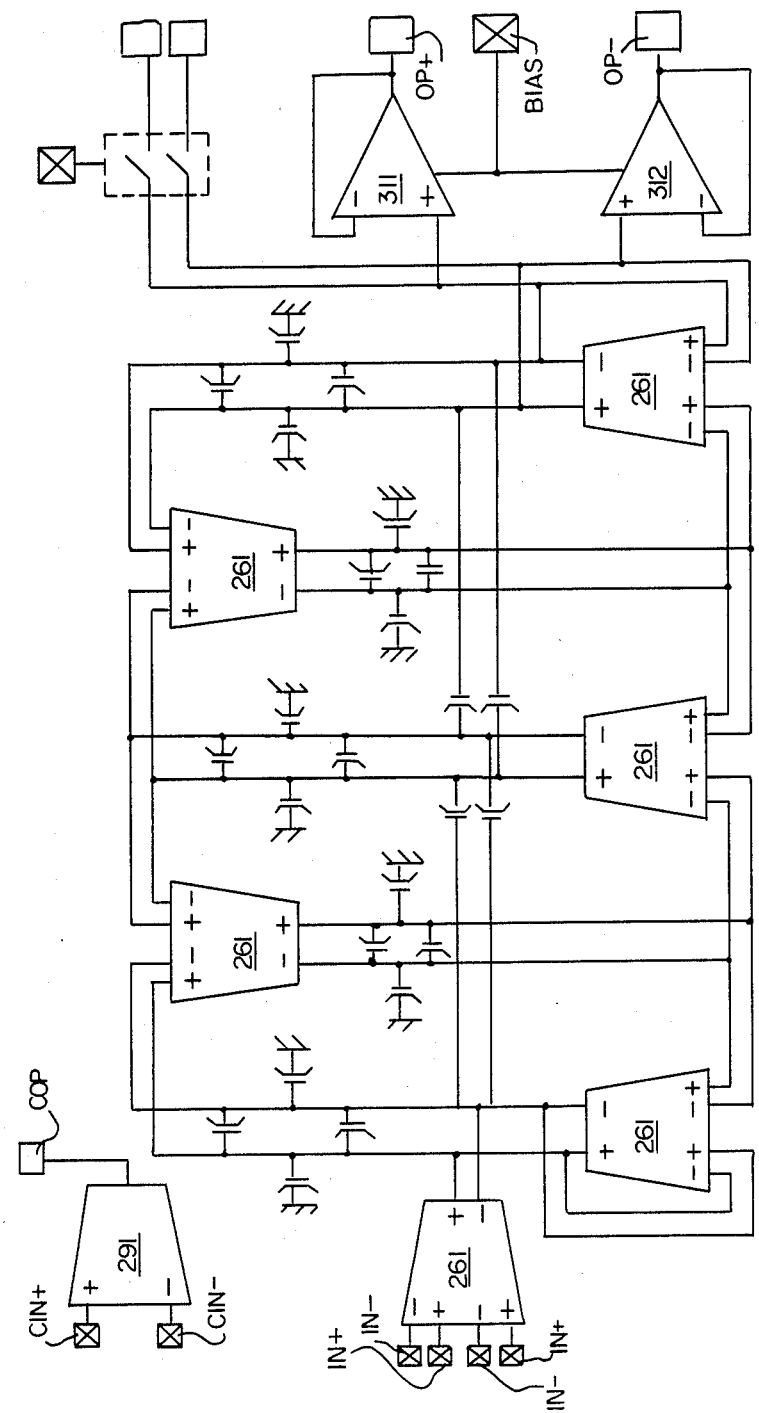
FIG. 35 shows an alternative transconductor filter arrangement.

An alternative circuit is shown in FIG. 35. In this circuit the transmission zeros are realised by simple floating capacitors at the expense of sensitivity to parasitic capacitance variation. For this particular filter response these floating capacitors are relatively small, so the parasitics should only have a minor effect. Also the part of the load capacitance driven by each transconductor is fully-floating between the output terminals to reduce the total capacitance. Some grounded capacitance is necessary for common-mode stability. The area of this filter is 4.0 mm$^2$, of which the capacitors and transconductors occupy only 2.0 mm$^2$, the remaining space being occupied by the output buffer op amps and interconnect to bonding pads.

A prototype 5th order 0.18 dB Cauer CMOS low pass active integrated filter circuit corresponding to the circuit shown in FIG. 35 has been produced.

All transconductors have the same tansconductance and are identical for good matching. Thus the shape of the frequency response is set by the ratios of the capacitors, which can be set accurately and reproducibly by suitable layout techniques. Sensitivity to residual manufacturing variations is low, since the node capacitances correspond to L and C values of the prototype LC ladder.

Stray capacitance to ground from the top plates of the grounded capacitors arise from the input and output capacitances of the transconductors, from capacitance from the interconnecting metallisation to the substrate, and from capacitances from the top and bottom plates of floating capacitors to ground. These parasitics appear directly in parallel with the intended plate-to-plate capacitance, and have to be calculated and compensated for by adjustment of the capacitor values to obtain the desired frequency response. However, such strays are typically only a few percent of the total effective capacitance on each node, so a small error in this correction will have minimal effect on the response of the filter. This contrasts with the case of switched-capacitor filters, where the input switched capacitors are usually smaller than the switch and amplifier input capacitances demanding the adoption of "parasitic-insensitive" techniques.

The load capacitance on each transconductor output is implemented by a combination of floating and grounded capacitances. The use of fully-floating capacitors can reduce the total capacitor area for a given circuit impedance by a factor of four. However, to ensure highfrequency common-mode stability, some grounded capacitance is necessary. In this design, the total capacitor area was halved compared to a fully-grounded design.

FIGS. 36 to 39 summarise results obtained from the first tested device. The response at the nominal 28 kHz cut-off frequency shown in FIGS. 36 and 37 agrees closely with the theoretical 0.18 dB passband ripple and 61.4 dB stopband attenuation.

Simply by adjusting the control voltage VB (through changing Rref), the 3 dB cut-off frequency can be varied from 5 to 90 kHz before being limited by quiescent bias constraints. In the high frequency extreme there is about 0.2 dB extra peaking at the passband edge, at the low-frequency extreme the first passband minimum is accentuated 0.1 dB. The small size of these deviations demonstrates the effectiveness of the phase neutralisation in reducing excess phase effects.

FIG. 38 shows a plot of relative second and third harmonic distortion components against output signal amplitude at the worst-case frequency (10 kHz) for a 28 kHz filter. At low signal levels the distortion is dominated by the second harmonic, presently thought to be due to both device mismatches and test-board imperfections. The third harmonic increases at the expected rate of 12 dB/octave, being 64 dB down at an output level of 2V peak-peak ($-3$ dBV).

FIG. 39 shows the spectral dependence of the output noise. This is dominated by the 1/f noise of the n-channel devices and peaks near the passband edge. The total noise integrated over the passband is 0.34 mVrms, which gives a dynamic range of 69.4 dB with respect to 1 Vrms.

Compared to switched-capacitor filters, continuous-time filters according to the invention have the following advantages:

(i) No aliasing of input or imaging of output signals: This simplifies the interface to unsampled systems, by removing the need for anti-aliasing prefilters and smoothing post-filters; sampled-data systems can include c-t filter blocks without clock-synchronisation problems.

(ii) No aliasing of high-frequency power supply or amplifier noise: In SC filters, the op amp PSRR reduces with frequency allowing high-frequency components of power supply ripple (e.g. from switching regulators) to be aliased down to baseband with little attenuation. Similarly the h.f. noise from wideband op amp output stages is aliased down to baseband. Such effects are particularly significant in the electrically noisy environment of combined analogue-digital chips.

(iii) Circuit simplicity: SC filters require the generation of multi-phase complementary clock waveforms and their distribution to switches. This complicates the interconnect net, and constrains layout.

(iv) Simplicity of circuit synthesis: Conventional active filter methods can be used to obtain component values, rather than the complex sampled data algorithms required for accurate design of SC filters.

(v) Computer simulation: The complete circuit can be simulated using SPICE down to the transistor level, to include the effects of all parasitics. Together with automated circuit extraction programmes, this allows a full CAD loop to be established between the circuit laid out and the desired performance specification. This is impossible with SC filters, even using special purpose simulators and with manual intervention to incorporate foreseen second order effects. This is perhaps the most significant advantage for custom integrated filters, where the risk of first-pass design malfunction and consequent redesign interactions must be minimised to provide an economic and credible customer interface.

A major disadvantage of c-t filters is the requirement for an on-chip control loop however, this is not a significant overhead for complex filters.

The above analysis has concentrated on a circuit using n-channel MOS transistors. The results are also applicable to circuits using other similar devices such as p-channel MOSTs, junction field-effect transistors or thermionic valves. The exact form of equations 1 and 2 is unimportant: any pair of devices of a type with an approximately linear relationship between the current out of one terminal and the voltage applied between two other terminals could be used as input devices in similar circuits in a similar mode and improved linearity obtained over a simple singlesided circuit. For example, MOSTs with sub-micron channel lengths may exhibit an almost linear rather than square-law dependence of drain current on gate-source voltage, even in saturation-mode operation and could be especially suitable for high-speed filters.

The above transconductor circuits are single-input and dual-input transconductors. The circuits can be generalised by including more input devices in parallel to realise multi-input transconductors. The input devices can be scaled in geometry to provide weighted inputs.

The above description has concentrated on the application of transconductor circuits to active filters. The transconductor can also be used in other known applications of voltage-controlled current sources, such as voltage-to-current converters, waveform generation, voltage-controlled oscillators and integrators. Signals can be weighted and summed by using transconductors connected in parallel with common output terminals or by using multi-input transconductors.

By modulating the drain voltage of the input transistors through the bias voltage VB, the output current becomes proportional to both the drain voltage and to the input differential signal voltage. In this way a two-quadrant multiplier is realisable. This could be used to mix signals of different frequencies, possibly embedded in a filter structure.

Alternatively, by keeping VB fixed at an appropriate voltage, the transconductance obtained becomes a function of temperature and the circuit could be used as a temperature transducer. If the transconductor is part of an oscillator, this would become a temperature-controlled oscillator. Comparing its oscillation frequency against a reference frequency would give a digital output.

The transconductance of the input devices will be affected by strain in the substrate. If two or more transconductors are fabricated in proximity on the same substrate but in different orientations and driven with equal bias voltages, the ratio of their transconductances is a measure of the local strain. This ratio could be measured by extra circuitry. For example, the oscillation frequencies of two orthogonal transconductor oscillators could be obtained by digital counter circuitry.

Even within the field of application of active filters, other types of active filter than the LC ladder based designs shown above are possible. For example, biquadratic stages of signal-flow-graph networks can be used. Also the capacitor network around the transconductors need not be permanently connnected, but could include different capacitors, which could be taken in or out of the network by means of series or shunt switches, such as CMOS transmission gates. These switches could be controlled by electrical control signals applied externally to the filter circuit, or by on-chip fusible links or EPROM devices. The network could also be laid out to enable permanent reconfiguration or trimming of the network by electron-beam or laser technology.

Also, the capacitor network can be switched to make it timevarying, to incorporate functions such as signal frequency shifting or chopper-stabilisation.

The phase neutralisation technique described above is applicable to active filters using other differential input amplifier stages.

The common-mode feedback techniques described above are also applicable to other designs of differential-output amplifiers, such as high-gain operational transconductance amplifiers.

I claim:

1. A differential input transconductor including a pair of field-effect transistors each having a substrate terminal, a source terminal, a gate terminal and a drain terminal, wherein the source terminals of the pair are connected together to a first fixed voltage; the substrate terminals of the pair are connected to a second fixed voltage; means is provided to set equal quiescent voltages on the gate terminals and to superimpose equal but opposite signal voltages on the two gate terminals; and means is provided to maintain the voltages on the drain terminals of the two transistors at an equal voltage chosen to keep the transistors in the triode region of operation for the expected variation of the gate-source voltage, the drain terminals of the pair of transistors being connected to an output circuit to maintain the voltage on the drain terminals at the chosen voltage and to transmit a differential mode output current component of the transconductor via output terminals to a load circuit at a higher impedance level, the output circuit comprising a first pair of transistors each defining a common-gate MOS stage and the output circuit including a further pair of transistors each of which is connected to a respective one of the first pair of transistors of the MOS stage, said first pair and said further pair being of opposite polarity type and being connected together in a feedback loop such that the input impedance seen at the drain terminals of the pair of field effect transistors is reduced below that of the common-gate MOS stage by a factor equal to the loop gain of the feedback loop.

2. A differential input transconductor including a pair of field-effect transistors each having a substrate terminal, a source terminal, a gate terminal and a drain terminal, wherein the source terminals of the pair are connected together to a first fixed voltage; the substrate terminals of the pair are connected to a second fixed voltage; means is provided to set equal quiescent voltages on the gate terminals and to superimpose equal but opposite signal voltages on the two gate terminals; and means is provided to maintain the voltages on the drain terminals of the two transistors at an equal voltage chosen to keep the transistors in the triode region of operation for the expected variation of the gate-source voltage, a pair of capacitors being connected between respective drain terminals of each transistor and the gate terminal of the opposite transistor, to minimize the phase delay between the input voltage and the output current of the transconductor.

3. A differential input transconductor including a pair of field-effect transistors each having a substrate terminal, a source terminal, a gate terminal and a drain terminal, wherein the source terminals of the pair are connected together to a first fixed voltage; the substrate terminals of the pair are connected to a second fixed voltage; means is provided to set equal quiescent voltages on the gate terminals and to superimpose equal but opposite signal voltages on the two gate terminals; and means is provided to maintain the voltages on the drain terminals of the two transistors at an equal voltage chosen to keep the transistors in the triode region of operation for the expected variation of the gate-source voltage, the drain terminals of the pair of transistors being connected to an output circuit to maintain the voltage on the drain terminals at the chosen voltage and to transmit a differential mode output current component of the transconductor via output terminals to a load circuit at a higher impedance level, the voltages at the output terminals being applied to the inputs of a summing amplifier stage to give an output signal representing the common-mode component of the output terminal voltages, and this output signal controlling a pair of current sources injecting equal currents into respective nodes of two symmetric halves of the transconductor, the polarity of these currents being such as to stabilize the common-mode component of the output voltages.

4. A differential input transconductor including a pair of field-effect transistors each having a substrate terminal, a source terminal, a gate terminal and a drain terminal, wherein the source terminals of the pair are connected together to a first fixed voltage; the substrate terminals of the pair are connected to a second fixed voltage; means is provided to set equal quiescent voltages on the gate terminals and to superimpose equal but opposite signal voltages on the two gate terminals; the drain terminal of each one of the pair of field-effect transistors is connected to a respective emitter of a first pair of bipolar transistors; means is provided to maintain the base terminals of the bipolar transistor of the first pair of bipolar transistors at a constant voltage chosen so that the field-effect transistors remain biased in the triode region of operation over the expected variation in gate-source voltage; the collector terminal of each of the bipolar transistors of the first pair of bipolar transistors is connected to a respective one of a first pair of current sources and to the base terminal of the respective one of a second pair of bipolar transistors, the second pair of bipolar transistors being of opposite polarity type to the first pair of bipolar transistors; the collector of each said respective second pair of bipolar transistors being connected to the emitter of the said respective bipolar transistor of the first pair of bipolar transistors; the emitter of each of said second pair of bipolar transistors being connected to the emitter of a respective one of a third pair of transistors having respective collector terminals and also to the respective one of a second pair of current sources; output currents being taken from each of the collectors of the third pair of transistors, via a respective output terminal.

* * * * *

UNITED STATES PATENT AND TRADEMARK OFFICE
CERTIFICATE OF CORRECTION

PATENT NO. : 4,823,092

DATED : April 18, 1989

INVENTOR(S) : JOHN LAURENCE PENNOCK

It is certified that error appears in the above-identified patent and that said Letters Patent is hereby corrected as shown below:

Column 2, line 10, "Fullydifferential" should be --Fully-differential--.

Column 4, lines 3 and 4, "Fig 26A" should appear after "Fig. 26".

Column 5 and 6, lines 15-45, insert number indicators (7), (8), (9), (12) and (13) after appropriate formula (see original specification, page 7, lines 9-20, for appropriate placing of number indicators).

Column 6, lines 50-55, insert number indicators (17) and (18) after appropriate formula (see original specification, page 8, lines 15-19, for appropriate placing of number indicators).

Column 6, line 61, "differentialmode" should be --differential-mode--.

Column 7 and 8, lines 1-10, insert number indicators (19), (20) and (21) after appropriate formula (see original specification, page 8, lines 30-35, for appropriate placing of number indicators).

Column 12, line 33, "transconductor" should be --transconductors--.

Signed and Sealed this

Seventeenth Day of July, 1990

Attest:

HARRY F. MANBECK, JR.

*Attesting Officer*  *Commissioner of Patents and Trademarks*